United States Patent [19]
Drost et al.

[11] Patent Number: 5,955,911
[45] Date of Patent: Sep. 21, 1999

[54] ON-CHIP DIFFERENTIAL RESISTANCE TECHNIQUE WITH NOISE IMMUNITY AND SYMMETRIC RESISTANCE

[75] Inventors: Robert J. Drost, Palo Alto; Robert J. Bosnyak, San Jose; Jose M. Cruz, Palo Alto, all of Calif.

[73] Assignee: Sun Microsystems, Inc., Palo Alto, Calif.

[21] Appl. No.: 08/944,141

[22] Filed: Oct. 6, 1997

[51] Int. Cl.$^6$ .............................. H03K 17/62; H03L 5/00
[52] U.S. Cl. ........................................... 327/404; 327/308
[58] Field of Search .................................. 327/403, 404, 327/405, 552, 558, 344, 334, 103, 530, 308; 330/258, 144; 333/81 R

[56] References Cited

U.S. PATENT DOCUMENTS

| | | | |
|---|---|---|---|
| 4,611,135 | 9/1986 | Nakayama et al. | 307/572 |
| 5,359,235 | 10/1994 | Coyle et al. | 327/108 |
| 5,378,950 | 1/1995 | Takamoto et al. | 327/401 |
| 5,430,408 | 7/1995 | Ovens et al. | 327/404 |
| 5,477,169 | 12/1995 | Shen et al. | 326/55 |
| 5,634,014 | 5/1997 | Gist et al. | 395/280 |
| 5,831,453 | 11/1998 | Stamoulis et al. | 326/113 |

OTHER PUBLICATIONS

Kyeongho Lee, Sungjoon Kim, gijung Ahn, and Deog-Kyoon Jeong; "A CMOS Serial Link for Fully Duplexed Data Communication," IEEE Journal of Solid–State Circuits, vol. 30, No. 4, Apr. 1995, pp. 353–364.

Randy Mooney, Charles Dike, and Shekhar Borkar; "A 900 Mb/s Bidirectional Signaling Scheme," IEEE Journal of Solid–State Circuits, vol. 30, No. 12, Dec. 1995, pp. 1538–1543.

Jan M. Rabaey, *Digital Integrated Circuits,* "Designing Combinational Logic Gates in CMOS," Prentice Hall, 1996, pp. 213–214.

Paul Horowitz and Winfield Hill, *The Art of Electronics Second Edition,* Cambridge University Press, New York, NY, 1980, 1989, pp. 142–143.

*Primary Examiner*—Kenneth B. Wells
*Assistant Examiner*—Hai L. Nguyen
*Attorney, Agent, or Firm*—Skjerven, Morrill, MacPherson, Franklin & Friel, L.L.P.; Michael P. Noonan

[57] ABSTRACT

An on-chip resistance to an input current of an input signal includes a parallel transistor resistor and a control circuit for biasing the transistors of the parallel transistor resistor. The parallel transistor resistor includes first and second transistors of first and second types. Each transistor includes first and second current handling terminals and a control terminal. The control terminals are coupled to receive control signals from the control circuit. The first current handling terminals are coupled to provide an input node for receiving an input signal, and the second current handling terminals are coupled to provide an output signal. The control circuit is coupled to provide the first and second control signals for biasing the respective first and second transistors so that a first derivative of a resistance of the parallel transistor resistor in relation to an input-to-output voltage is zero at a selectable operation point.

15 Claims, 3 Drawing Sheets

ON-CHIP DIFFERENTIAL RESISTANCE TECHNIQUE WITH NOISE IMMUNITY AND SYMMETRIC RESISTANCE

BACKGROUND

1. Field of the Invention

The present invention relates to electronic circuits, and, more particularly, to implementation and use of on-chip resistances.

2. Description of the Related Art

In integrated circuits there are great cost savings associated with implementing a circuit element such as a resistor with on-chip components. Transistors are one method of providing on-chip or integrated resistors. For example, in the linear region of the drain curve, a field-effect transistor (FET) behaves like a voltage-controlled resistor. A single FET can provide a linear, voltage-controlled resistance for small signals of either polarity. However, the FET's effective resistance is highly non-linear in that it has a dependence on the drain and source voltages. For example, at low $V_{DS}$, an n-channel Metal-Oxide Semiconductor (NMOS) transistor has low resistance, but at high $V_{DS}$, an NMOS transistor's resistance increases dramatically. Even within a restricted input voltage swing, a transistor's resistance value can vary greatly and is asymmetric within a range of input voltages. Also, complementary MOS transistors exhibit large variations in performance with process, voltage supply, and temperature conditions. Therefore, although an ideal resistor has exactly the resistance desired and has no voltage dependence on the voltage at the input terminals, actual on-chip resistors only approximate this behavior.

There are several cases in which an accurate, noise immune resistance is desirable. For example, such a resistance is desirable for on-chip low pass filtering of input differential signals for adaptive receiver equalization to compensate for transmission line attenuation. In this example, an exponential moving average of the signal may be desired for use in an equalization scheme where the "tracked" average value is used to follow intersymbol interference caused by channel attenuation.

Also, an accurate, noise-immune resistance is desirable for on-chip termination of fiber channel, gigabit ethernet, firewire, lvds, or in general any high speed differential channel. Also, such a resistance is desirable when components are typically not on-board for cost reasons, when on-chip termination presents better signal integrity for the receiver's eye diagram, or when multiple possible cable impedances imply that the user wants to be able to use a modifiable termination resistance to terminate multiple possible values (e.g. 50 ohms or 75 ohms).

One previous on-chip resistor implementation provides an impedance matching circuit to terminate transmission lines. K. Lee, S. Kim, G. Ahn, D K. Jeong, "A CMOS Serial Link for Fully Duplexed Digital Data Communication," IEEE J. Solid-State Circuits, vol. 30, no. 4, pp. 353–363, April 1995. On-chip voltage controlled resistors (VCR's) are connected between $V_{DD}$ and the cable ends, which are controlled by the common impedance matching circuit. The impedance matching circuit generates a voltage-controlled resistor control signal which sets the resistance according to an external resistance value. Lee et al. does not compensate for the non-linearity in the resistance. Also, Lee et al. requires a direct current pull-down path to sink the sourced current. Additionally, such a configuration is sensitive to common-mode noise on the input signal and the positive supply.

Another termination scheme is disclosed in R. Mooney, C. Dike, S. Borkar, "A 900Mb/s Bidirectional Signaling Scheme," IEEE J. Solid-State Circuits, vol. 30, no. 12, pp. 1538–1543, December 1995. Because Mooney et al. is digital, the exact termination value is rarely available. The Mooney et al. implementation also does not compensate for the non-linearity of MOS transistors, and is again sensitive to common-mode noise on the input signals, the positive supply and, in addition, the negative supply.

SUMMARY

It has been discovered that pass transistors may be coupled in parallel to provide an on-chip resistance circuit element. Such a configuration provides an accurate and controllable resistance that is resistant to noise and process, voltage and temperature variations. Such a configuration further provides a first order resistance that varies less over a range of input voltage swings than standard on-chip resistors such as single transistor resistors. Furthermore, the resulting resistance is symmetric about a range of input voltages. For example, when an input signal is differential with small signal swing about a common mode level, a parallel transistor resistor provides a symmetric resistance having a maximum at the common mode level and a slightly lower resistance at either extreme of the input voltage swing. Such a resistance also has a lower rate of change of resistance across a range of input voltages than a single transistor resistor across the same range of input voltages. By coupling pass transistors in parallel, the useful voltage range of the adjustable resistor is extended.

In one embodiment, an apparatus for providing a resistance to an input current of an input signal includes a parallel transistor resistor and a control circuit for biasing the transistors of the parallel transistor resistor. The parallel transistor resistor includes first and second transistors of first and second types. Each transistor includes first and second current handling terminals and a control terminal. The control terminals are coupled to receive control signals from the control circuit. The first current handling terminals are coupled to provide an input node for receiving an input signal, and the second current handling terminals are coupled to provide an output signal. The control circuit is coupled to provide the first and second control signals for biasing the respective first and second transistors so that a first derivative of a resistance of the parallel transistor resistor in relation to an input-to-output voltage is zero at a selectable operation point.

In another embodiment, an apparatus includes a parallel transistor resistor and means for generating first and second control signals for biasing the parallel transistor resistor so that a first derivative of a resistance of the parallel transistor resistor in relation to an input-to-output voltage is zero at a selectable operation point.

In another embodiment, a method for providing an on-chip resistance includes the following: providing a first transistor of a first type on an integrated circuit chip, the first transistor including first and second current handling terminals and a control terminal, the control terminal of the first transistor being coupled to receive a first control signal; providing a second transistor of a second type on the integrated circuit chip, the second transistor including first and second current handling terminals and a control terminal, the control terminal of the second transistor being coupled to receive a second control signal, the first current handling terminal of the second transistor being coupled to the first current handling terminal of the first transistor, the second current handling terminal of the second transistor being coupled to the second current handling terminal of the first transistor; and generating first and second control signals for biasing the respective first and second transistors so that a first derivative of a resistance of the parallel transistor resistor in relation to an input-to-output voltage is zero at a selectable operation point.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

DETAILED DESCRIPTION

Figure 1:
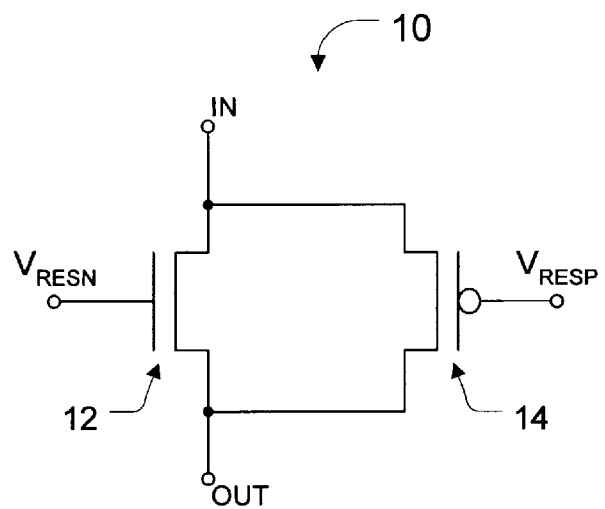
FIG. 1 is a circuit diagram of a parallel transistor resistor according to an embodiment of the invention.

The following sets forth a detailed description of a preferred embodiment of the invention. The description is intended to be illustrative of the invention and should not be taken to be limiting. Many variations, modifications, additions, and improvements may fall within the scope of the invention as defined in the claims that follow.

In one embodiment of the invention, transistors are coupled in parallel to form a parallel transistor resistor. The transistors described herein may be conceptualized as having a control terminal which controls the flow of current between a first current handling terminal and a second current handling terminal. An appropriate condition on the control terminal causes a current to flow from/to the first current handling terminal and to/from the second current handling terminal.

For example, an insulated gate field effect transistor (IGFET) may be conceptualized as having a control terminal which controls the flow of current between a first current handling terminal and a second current handling terminal. Although IGFET devices are frequently discussed as having a drain, a gate, and a source, in most such devices the drain is interchangeable with the source. This is because the layout and semiconductor processing of the transistor is frequently symmetrical. For an n-channel IGFET device, the current handling terminal normally residing at the higher voltage is customarily called the drain. The current handling terminal normally residing at the lower voltage is customarily called the source. A sufficient voltage on the gate (relative to the source voltage) causes a current to therefore flow from the drain to the source. The source voltage referred to in n-channel IGFET device equations merely refers to which drain or source terminal has the lower voltage at any given point in time. For example, the "source" of the n-channel device of a bi-directional CMOS transfer gate depends on which side of the transfer gate is at the lower voltage. To reflect this symmetry of most n-channel IGFET devices, the control terminal may be deemed the gate, the first current handling terminal may be termed the "drain/source", and the second current handling terminal may be termed the "source/drain". Such a description is equally valid for a P-channel IGFET device, since the polarity between drain and source voltages, and the direction of current flow between drain and source, is not implied by such terminology. Alternatively, one current-handling terminal may arbitrarily deemed the "drain" and the other deemed the "source", with an implicit understanding that the two are not distinct, but interchangeable.

IGFETs are commonly referred to as MOSFET devices (which literally is an acronym for "Metal-Oxide-Semiconductor Field Effect Transistor"), even though the gate material may be polysilicon or some material other than metal, and the dielectric may be oxynitride, nitride, or some material other than an oxide. The use of such historical legacy terms as MOSFET should not be interpreted to literally specify a metal gate FET having an oxide dielectric.

FIG. 1 shows adjustable parallel transistor resistor 10 according to an embodiment of the invention. Resistor 10 includes transistors 12 and 14 coupled in parallel. Transistors 12 and 14 are coupled in parallel to provide a controllable resistance to current flowing between the IN and OUT terminals. Transistors 12 and 14 are biased by control circuitry (not shown in FIG. 1) such that the net resistance of the parallel combination of transistors 12 and 14 exhibits a symmetry about a selected operating point. The control signals $V_{RESN}$ and $V_{RESP}$ are generated by the control circuitry to individually bias transistors 12 and 14 to control the resistance of resistor 10. Alternatively, the control circuitry may couple the control signals to power rails such that transistors 12 and 14 are always evenly conducting so as to provide a resistance determined by the size of transistors 12 and 14 and the voltage drop from IN to OUT.

Transistors 12 and 14 are IGFETs having different polar types. For example, transistor 12 is an n-channel device, and transistor 14 is a p-channel device. Transistors 12 and 14 are MOSFETs. The drain of transistor 12 is coupled to the source of transistor 14 to provide an input terminal of resistor 10. The source of transistor 12 is coupled to the drain of transistor 14 to provide an output terminal of resistor 10. The control terminal or gate of transistor 12 is coupled to receive the control voltage $V_{RESN}$, and the gate of transistor 14 is coupled to receive the control voltage $V_{RESP}$.

Although resistor 10 is shown as having an input node IN and an output node OUT, resistor 10 is a bidirectional resistance circuit. Input node IN may be used as an input, and output node OUT may be used as an output. Alternatively, input node IN may be used as an output, and output node OUT may be used as an input.

Figure 2:
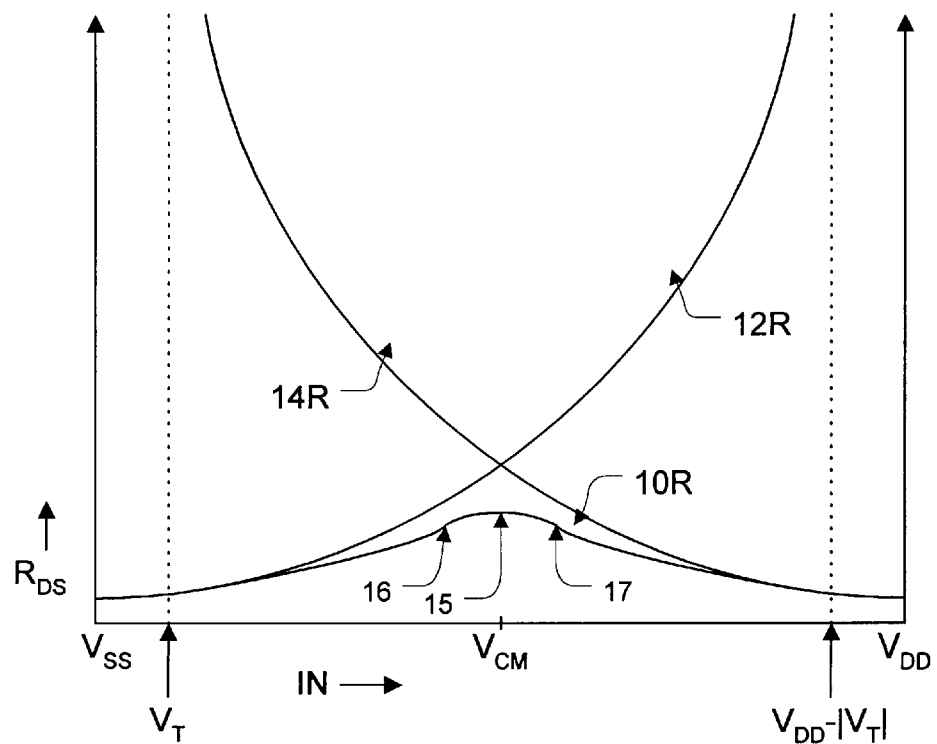
FIG. 2 shows a graph of resistance versus input voltage of a parallel transistor resistor according to an embodiment of the invention.

FIG. 2 shows a graph of the respective resistances 12R and 14R of transistors 12 and 14 and the combined resistance 10R of parallel transistor resistor 10. When $V_{RESN}$ is higher than the gate-to-source threshold voltage $V_T$ of transistor 12, transistor 12 is conducting for signals from ground to within a few volts of a maximum signal voltage $V_{DD}$ (where its resistance 12R starts increasing dramatically). Similarly, when $V_{RESP}$ is lower than $V_{DD} - |V_T|$, transistor 14 is conducting for signals from $V_{DD}$ to within a few volts of ground (where its resistance 14R increases dramatically). Thus, signals anywhere between $V_{DD}$ and ground are passed through with low series resistance 10R.

Resistance 10R has a maximum value and is symmetric about operational point 15. For a given input voltage swing between operational points 16 and 17, resistance 10R has the maximum value at the mid-swing or common mode voltage of input signal IN. Resistances 12R and 14R have a much greater variance for the same input voltage swing and are asymmetric through the input voltage swing. Thus, transistors 12 and 14 operate together so that the resistance 10R has minimal variation about a common mode voltage $V_{CM}$. Resistance 10R is therefore less dependent on input voltage IN. The total variation in resistance 10R is less than half that of the non-symmetric resistances 12R and 14R for the same voltage range of region 15.

Control signals $V_{RESN}$ and $V_{RESP}$ bias transistors 12 and 14 to operate so that the resistance 10R is selectable. For example, in a first state, $V_{RESN}$ and $V_{RESP}$ have values which bias transistors 12 and 14 so that resistance 10R has a representative curve as shown in FIG. 2. In operation, voltage fluctuations of input signal IN militate towards changing the representative curve 10R such that it might become asymmetrical and have a deflected maximum point. In a second state, either or both of $V_{RESN}$ and $V_{RESP}$ have different values which bias transistors 12 and 14 so that resistance 10R is driven towards having a symmetrical curve as shown in FIG. 2 throughout such input voltage fluctuations. Resistance 10R may therefore be set to have a particular representative curve within the operating range of the circuit in which resistor 10 is included. For example, if the resistance of resistor 10 is higher at a higher input voltage IN at operational point 17 than at a lower input voltage at operational point 16, the resistance curve 10R displays an asymmetry in that its higher voltage resistance is higher than its lower voltage resistance and the maximum point 15 shifts to the right. PMOS transistor 14 may be strengthened to decrease the resistance 10R at the higher input voltage. When PMOS transistor 14 is strengthened by reducing control voltage $V_{RESP}$, the resistance 10R is lowered at higher voltages, thereby producing a more symmetrical resistance.

Figure 3:
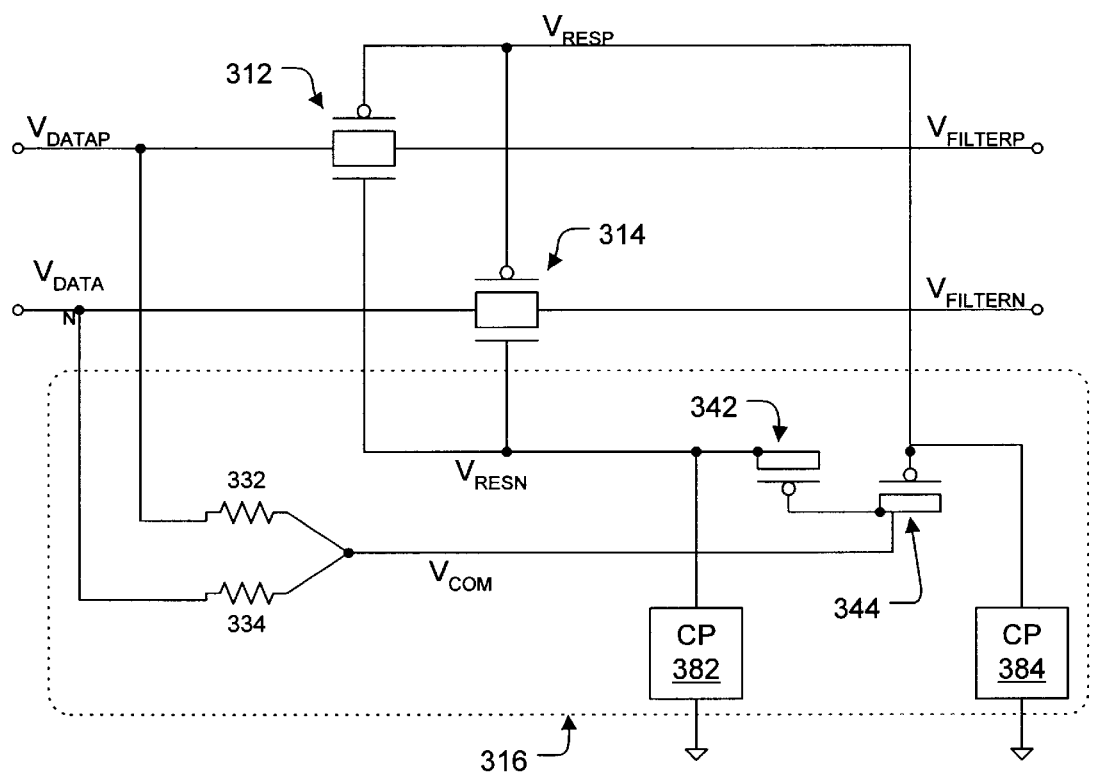
FIG. 3 is a circuit diagram of a parallel transistor resistor in an adjustable equalization circuit according to an embodiment of the invention.

In one embodiment, an equalization circuit for low pass filtering of an input signal includes resistor 10 as resistors 312 and 314. FIG. 3 shows such an embodiment in which a control loop uses a property of an RC filter, such as making equal the rise and fall times of the signals (e.g., by looking to equalize the zero-crossing times of the filtered signal), to set the resistances of resistors 312 and 314 to be symmetric. In one embodiment, the data inputs are received and filtered to produce filter data inputs. The data inputs and filter data inputs are then provided to comparators (not shown) for equalization of the incoming data signals.

Referring to FIG. 3, equalization circuit 300 includes resistors 312 and 314, and control circuit 316. Control circuit 316 includes resistors 332 and 334, capacitors 342 and 344 and charge pumps 382 and 384. Resistor 332 has a first terminal coupled to an input $V_{DATAP}$ and a second terminal coupled to a common node $V_{COM}$. Resistor 334 has a first terminal coupled to an input $V_{DATAN}$ and a second terminal coupled to the common node $V_{COM}$.

Resistor 312 includes parallel coupled NMOS and PMOS transistors having first current handling terminals coupled to the input $V_{DATAP}$ and second current handling terminals coupled to an output $V_{FILTERP}$. Resistor 314 includes parallel coupled NMOS and PMOS transistors having first current handling terminals coupled to the input $V_{DATAN}$ and second current handling terminals coupled to an output $V_{FILTERN}$. The gates of the NMOS transistors of resistors 312, 314 are coupled to a resistance control node $V_{RESN}$. The gates of the PMOS transistors of resistors 312, 314 are coupled to a resistance control node $V_{RESP}$. Resistance control nodes $V_{RESN}$ and $V_{RESP}$ are respectively coupled to charge pumps 382 and 384 which pump current onto resistance control nodes $V_{RESN}$ and $V_{RESP}$ to control the resistances of resistors 312 and 314.

Capacitor 342 has a first terminal coupled to resistance control node $V_{RESN}$ and a second terminal coupled to the common node $V_{COM}$. Capacitor 344 has a first terminal coupled to resistance control node $V_{RESP}$ and a second terminal coupled to the common node $V_{COM}$. In one embodiment, capacitors 342 and 344 are capacitor-configured PMOS transistors in an N-well technology. In such an embodiment, $V_{RESP}$ is lower than $V_{COM}$ for capacitor 344 to operate because PMOS transistors require the gate voltage to be lower than the channel for conduction to occur. In other embodiments, other technologies may use NMOS transistors or other embodiments of capacitors 342 and 344.

Charge pumps 382 and 384 control the resistance control signals $V_{RESN}$ and $V_{RESP}$ by pumping current onto the respective nodes for storing by capacitors 342 and 344. Charge pumps 382 and 384 are configured to control the resistances of 312 and 314 so that the resistances are symmetric about the common mode voltage level. For example, if the RC time constant is longer at a higher input voltage than at a lower input voltage, then the PMOS transistors must be strengthened to increase the resistance of resistors 312 and 314 at the higher input voltages. When the VRESP is increased, the resistances of resistors 312, 314 are lowered at the higher input voltages, thereby producing a symmetrical resistance.

Control circuit 316 individually controls the PMOS and NMOS control voltages $V_{RESP}$ and $V_{RESN}$ in such a way as to cause the first derivative of the resistances of resistors 312, 314 to be zero (i.e. a saddle point) at the common-mode level of the differential input signal $V_{DATA}$. A PMOS or NMOS pass transistor alone can not be controlled to do this since its resistance is monotonically increasing or decreasing as a function of the common-mode input signal level that is across the source and drain terminals of the transistor. In one embodiment, control circuit 316 samples rising edge transitions separately from falling edge transitions and adjusts $V_{RESP}$ and $V_{RESN}$ individually to equalize each transition separately. When this is done, the resistance saddle point for the input voltage common-mode level should be an automatic consequence, since otherwise one transition direction would not be exactly equalized. Such an embodiment is described in U.S. patent application, Ser. No. 08/944,599, filed on even date herewith, entitled "Adaptive Equalization Technique Using Twice Sampled Non-Return to Zero Data," naming Robert J. Drost, Robert Bosnyak and Jose M. Cruz as inventors, and which is incorporated herein by reference.

In operation, $V_{DATAP}$ and $V_{DATAN}$ pass through resistors 332 and 334, respectively, to create the common mode level $V_{COM}$ between the two data signals. Common mode level $V_{COM}$ provides a back or reference face for capacitors 342 and 344 which store the resistance control voltages $V_{RESN}$ and $V_{RESP}$, respectively. Instead of tying capacitors 342 and 344 to ground, capacitors 342 and 344 are tied to the common mode level of the positive and negative differential input signals $V_{DATAP}$ and $V_{DATAN}$. Therefore, any high frequency common mode noise on inputs $V_{DATAP}$ and $V_{DATAN}$ does not affect the resistance of resistors 312 and 314 because the noise is transferred to the gate voltages so that the control voltages remain constant with reference to the input voltages. If the $V_{GS}$ of each transistor remains constant, then the resistance remains constant. A bounce on $V_{DATAP}$ and $V_{DATAN}$ is transferred to $V_{COM}$ and then to $V_{RESP}$ and $V_{RESN}$ so that $V_{RESP}$ and $V_{RESN}$ bounce very quickly with $V_{DATAP}$ and $V_{DATAN}$. The $V_{COM}$ node tracks the variations of the common-mode level of the input to a bandwidth of around 500 Mhz for typical conditions. Thus any high frequency bounces on the supply or common-mode level of the inputs are tracked by the $V_{COM}$ signal up to that frequency. Other common mode variations in the input data and supply variations of low frequency which might change the effective resistances of resistors 312 and 314 are corrected by control circuit 316. Resistors 332 and 334 can be implemented by simple PMOS-NMOS pass transistor resistors 10 (see FIG. 1) with gate voltages tied to $V_{DD}$ and ground, respectively. The non-linearity of resisters 332 and 334 affects only the RC time constant of the tracking of the common mode voltage by $V_{COM}$, which need not be controlled as precisely.

In one embodiment, a transmission line termination circuit includes resistor 10 to terminate a transmission line at a selected resistance. Such a transmission line may be a cable, an on-board via, or some other form of transmission circuit. A transmission line has a characteristic impedance $Z_0$, meaning that a wave moving along the line has a ratio of voltage to current equal to $Z_0$. Typical co-axial lines have impedances in the range of 50 to 100 ohms. The sorts of conductor width and spacing used on printed circuit boards give a characteristic impedance in the neighborhood of 25–100 ohms.

The load of a line should be matched to the characteristic impedance of the line, especially at high frequencies. A transmission line terminated with a load equal to its characteristic impedance (resistance) will transfer an applied pulse to the termination without reflection so that all the power in the signal is transferred to the load. The impedance looking into such a terminated line, at any frequency, is equal to its characteristic impedance. Cables terminated with a resistance unequal to $Z_0$, including open circuits and short circuits, produce signal reflections with amplitude and phase depending on the impedance mis-match. Transmission line effects such as reflections from impedance mis-matching arise when digital signals are sent through cables or between instruments, even on a single circuit board.

Figure 4:
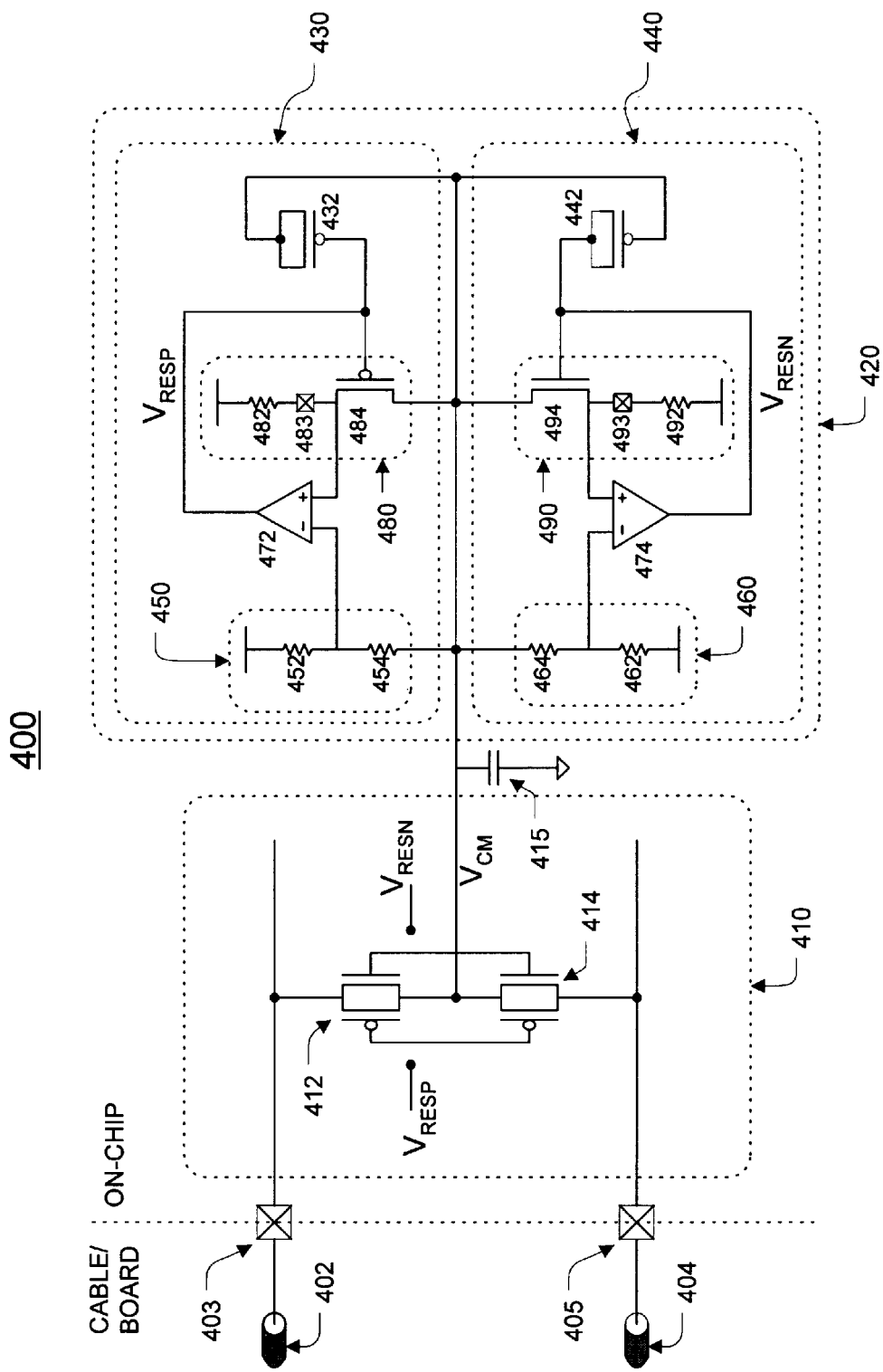
FIG. 4 is a circuit diagram of a parallel transistor resistor in a differential line termination circuit according to an embodiment of the invention.

FIG. 4 shows transmission line termination circuit 400 in accordance with an embodiment of the invention. Termination circuit 400 receives a plus/minus differential data signal over transmission lines 402 and 404 and pins 403 and 405, respectively. Each of transmission lines 402 and 404 have a characteristic impedance, $Z_0$. Transmission lines 402 and 404 are coupled to input circuitry (not shown) and line termination circuit 400. Termination circuit 400 provides a system for terminating a differential line effectively in a self-contained, substantially on-chip manner.

Termination circuit 400 includes differential resistance circuit 410 and bias circuit 420. Differential resistance circuit 410 includes resistors 412 and 414 which provide on-chip termination of transmission lines 402, 404 to common mode voltage node $V_{CM}$. The PMOS and NMOS transistors of resistors 412 and 414 are biased for controllable symmetric operation by bias circuit 420. For example, if the impedances of transmission lines 402, 404 are 50 ohms, bias circuit 420 biases each transistor of resistors 412 and 414 to a resistance of 100 ohms so that the parallel resistance of each of the resistors 412 and 414 is 50 ohms from the differential input line to the common mode voltage node $V_{CM}$. $V_{CM}$ is used by termination circuit 400 as a reference potential.

In one embodiment, $V_{CM}$ uses a large on-chip or off-chip capacitor coupled to a reference rail to allow a low impedance, AC termination of common mode input variations. For example, in the embodiment of FIG. 4, $V_{CM}$ is coupled to ground via capacitor 415. Depending on the technology, either ground or $V_{DD}$ may be used as the reference rail. For example, TTL references ground and pseudo-ECL references $V_{DD}$.

Bias circuit 420 includes positive bias circuit 430 and negative bias circuit 440. Positive bias circuit receives $V_{CM}$ from differential resistance circuit 410 and provides resistance control signal $V_{RESP}$ to differential resistance circuit 410. Negative bias circuit receives $V_{CM}$ from differential resistance circuit 410 and provides resistance control signal $V_{RESN}$ to differential resistance circuit 410. Thus, termination circuit 400 includes a control loop each for the PMOS and NMOS transistors of resistors 412 and 414, respectively.

Positive bias circuit 430 includes preset reference circuit 450, a comparison circuit such as amplifier 742, and controllable reference circuit 480. Preset reference circuit 450 provides a preset reference signal to amplifier 742. Controllable reference circuit 480 provides a controllable reference signal to amplifier 742. Amplifier 742 compares the values of the preset reference signal and the controllable reference signal, and generates resistance control signal $V_{RESP}$ depending on the result of the comparison. For example, resistance control signal can be driven more negative if the controllable reference signal has a value that is greater than the preset reference value. Controllable reference circuit 480 receives feedback from amplifier. For example, if resistance control signal $V_{RESP}$ is driven in a certain direction as a result of the comparison, the controllable reference signal is also driven in a certain direction, either the same or different direction depending on the implementation.

As shown in FIG. 4, the structure and operation of negative bias circuit 440 is similar to the structure and operation of positive bias circuit 430. However, preset reference circuit 460 and adjustable reference circuit 490 of negative bias circuit 440 are coupled between the $V_{CM}$ and ground instead of between $V_{CM}$ and $V_{DD}$ as in positive bias circuit 430. Also, transistor 484 in positive bias circuit 430 is a p-channel device whereas transistor 492 is an n-channel device. In an embodiment including capacitor-configured transistors such as capacitors 432 and 442, $V_{CM}$ may coupled to different nodes of the capacitors in different bias circuits. For example, in positive bias circuit 430, $V_{CM}$ is coupled to the source of drain of PMOS transistor-capacitor 432, whereas in negative bias circuit 440, $V_{CM}$ is coupled to the gate of PMOS transistor-capacitor 442.

More specifically, in the embodiment of FIG. 4, positive bias circuit 430 includes voltage divider 450, amplifier 472, adjustable voltage divider 480, and capacitor 432. Voltage divider 450 includes resistors 452 and 454 coupled in series between a power rail such as $V_{DD}$ and the common mode reference rail $V_{CM}$. Adjustable voltage divider 480 includes resistor 482 and transistor 484 coupled in series between the power rail and the common mode reference rail $V_{CM}$. Resistor 482 is off-chip and is coupled to transistor 484 via pin 483. Amplifier 472 receives the output of voltage divider 450 at a negative input and the output of adjustable voltage divider 480 at a positive input. Amplifier 472 generates resistance control signal $V_{RESP}$, which is provided to differential resistance circuit 410. $V_{RESP}$ is also provided as feedback to the control terminal of transistor 484. $V_{RESP}$ is further coupled to $V_{CM}$ via capacitor 432 which is a low pass filter integrating capacitor. In the embodiment of FIG. 4, capacitor 432 is a capacitor-configured PMOS transistor. $V_{RESP}$ is coupled to the gate of PMOS transistor 432, and $V_{CM}$ is coupled to the drain and source of PMOS transistor 432.

Resistors 452 and 454 of voltage divider 450 are on-chip resistors for forming a specific ratio to generate an output voltage referenced from $V_{DD}$ and $V_{CM}$. Because the ratio of resistors 452 and 454 determines the value of the voltage divider output as opposed to the specific resistance values, resistors 452 and 454 may be any type of on-chip resistance such as diffusion resistances or poly-silicon resistances that may even be susceptible to temperature variations. For example, if a ratio of 4:1 is desired, five identical poly strips (e.g., resistors of one and four strips) may be laid out adjacent to one another so that the strips have similar end and edge defects and have similar environmental effects acting upon them.

Resistor 482 of adjustable voltage divider 480 is an on-board, precision resistor. By selecting the resistance value of resistor 482 on board, the output of adjustable voltage divider 480 is controllable to a specific value with reference to $V_{DD}$ and $V_{CM}$. The value of resistor 482 is chosen with reference to the known size of transistor 484. The value of resistor 482 is also chosen so that the proper ratio may be constructed to control the PMOS transistors of resistors 412, 414 to provide matching impedances to transmission lines 402, 404.

Amplifier 472 is a high-gain, transconductance, operational amplifier. Amplifier 472 provides current to node $V_{RESP}$ which allows the adjustment of the resistance control voltage $V_{RESP}$ being stored on capacitor 432. The resistance control voltage $V_{RESP}$ controls transistor 484 to create the proper resistance ratio of voltage divider 480. Amplifier 472 adjusts the gate voltage of transistor 484 so that the output voltages of voltage dividers 450 and 480 are equal. As transistor 484 is adjusted to create the proper ratio, the PMOS transistors of resistors 412 and 414 are also being adjusted to create a resistance of $2*Z_0$.

Negative bias circuit 440 includes voltage divider 460, amplifier 474, adjustable voltage divider 490, and capacitor 442. Voltage divider 460 includes resistors 462 and 464 coupled in series between a power rail such as common ground and the common mode reference rail $V_{CM}$. Adjustable voltage divider 490 includes resistor 492 and transistor 494 coupled in series between the power rail and the common mode reference rail $V_{CM}$. Resistor 492 is off-chip and is coupled to transistor 494 via pin 493. Amplifier 474 receives the output of voltage divider 460 at a negative input and the output of adjustable voltage divider 490 at a positive input. Amplifier 474 generates $V_{RESN}$, which is provided to differential resistance circuit 410. $V_{RESN}$ is also provided as feedback to the control terminal of transistor 494. $V_{RESN}$ is further coupled to $V_{CM}$ via capacitor 442 which is a low pass filter integrating capacitor. In the embodiment of FIG. 4, capacitor 442 is a capacitor-configured PMOS transistor. $V_{RESN}$ is coupled to the drain and source of PMOS transistor 442, and $V_{CM}$ is coupled to the gate of PMOS transistor 442. Transistors 432 and 442 are p-channel devices because in an N-well technology PMOS transistors have a substrate contact that is isolated. In a P-well technology, NMOS transistors may preferably be used to implement capacitors 432 and 442. In a dual well technology, either PMOS or NMOS transistors may be used depending on the system.

Resistors 462 and 464 of voltage divider 460 are on-chip resistors for forming a specific ratio to generate an output voltage referenced from $V_{CM}$ and ground. Because the ratio of resistors 462 and 464 (as opposed to the individual resistance values) determines the value of the voltage divider output, resistors 462 and 464 may be any type of on-chip resistance such as those of resistors 452 and 454 discussed above.

Resistor 492 of adjustable voltage divider 490 is an on-board, precision resistor. By selecting the resistance value of resistor 492 on board, the output of adjustable voltage divider 490 is controllable to a specific value with reference to $V_{CM}$ and ground. The value of resistor 492 is chosen with reference to the known size of transistor 494. The value of resistor 492 is also chosen so that the proper ratio may be constructed to control the NMOS transistors of resistors 412, 414 to provide matching impedances to transmission lines 402, 404.

Amplifier 474 is a high-gain, transconductance, operational amplifier. Amplifier 474 provides current to node $V_{RESN}$ which allows the adjustment of the resistance control voltage $V_{RESN}$ being stored on capacitor 442. The resistance control voltage $V_{RESN}$ controls transistor 494 to create the proper resistance ratio of voltage divider 490. Amplifier 474 adjusts the gate voltage of transistor 494 so that the output voltages of voltage dividers 460 and 490 are equal. As transistor 494 is adjusted to create the proper ratio, the PMOS transistors of resistors 412 and 414 are also being adjusted to create a resistance of $2*Z_0$.

In order to achieve a symmetry of resistance of resistors 412, 414, (i. e., not constant, but also not monotonic) with a maximum near or at $V_{CM}$, the pass gate PMOS and NMOS transistors are each targeted to two times the value $Z_0$ of the characteristic impedance of transmission lines 402, 404, so that in parallel they provide a matching impedance of $Z_0$. In one embodiment, resistors 452 and 454 provide a ratio of 1:X on voltage divider 450. Resistor 482 is selected to provide a resistance of M times $Z_0$. Transistor 484 has a size bp. The control loop modifies the voltage $V_{RESP}$ until the effective resistance of PMOS transistor 484 is equal to $M*Z_0/X$. The pass gate PMOSs of resistors 412, 414 are size ap and have an effective resistance equal to $(ap/bp*M/X)*Z_0$. As noted, the first factor $ap/bp*M/X$ is targeted to have a value of 2 because a symmetric termination resistance of the pass gate transistors is desired. Similarly, $an/bn*N/Y=2$ for the NMOS transistors of resistors 412, 414. If the PMOS and NMOS transistors are selected to have the ratios $W_P/W_N=\mu_N/\mu_P$ ($\mu$ being the channel mobility of the transistors), then to first order the parallel combination of PMOS and NMOS transistors (of $2*Z_0$ resistance each) results in a symmetric resistance with a maximum very near to the common mode level of the input voltages.

The above ratios allow many possible specific values. In one embodiment, ap/bp equals an/bn which equals one. In other words, the transistors have the same size. Also, M equals N which equals 10 so that not too much power is dissipated in the control circuit, and X equals Y which equals 5. Apart from the ratios, the NMOS and PMOS transistors should be chosen with a large enough W/L ratio such that $V_{RESP}$ and $V_{RESN}$ do not exceed the output voltage compliance of the transconductance amplifiers 472 and 474.

The present invention uses a novel technique to provide noise immunity from common-mode noise on the input signal and from noise on the power and ground supplies. The input differential signal is passed through differential resistors (e.g., the termination resistors for the termination embodiment, or an extra two resistors for the low pass filter embodiment) to construct a signal, $V_{CM}$, that tracks the common-mode level of the input signal. $V_{CM}$ is used as the opposing voltage for the capacitors that store the PMOS and NMOS pass transistors control voltage. Thus common-mode noise on the input signal is transferred readily to the two control voltages so that the gate to source and gate to drain voltages for the NMOS and PMOS pass transistors are held effectively constant. Since the first order of the transistors' channel conductances are given by the gate to source voltage, we have provided the desired common-mode noise immunity. Noise from the power and ground supplies is isolated since it either couples in at high frequencies through parasitic nodes on the control voltages where the capacitor divider of the parasitic capacitance to the loop's filter capacitance can easily attenuate it by factors of greater than 300, or it is coupled in at low frequencies through the parasitic resistances, where the control loop can easily track out the noise. The $V_{CM}$ node can track the common mode voltage with an extremely low time constant. For $Z_0$=50 ohms, the low-pass resistance is 50/2 or 25 ohms. Assuming less than 2 picofarads of parasitic capacitance on the $V_{CM}$ node, the time constant of $V_{CM}$ with respect to tracking the signals common mode voltage is less than 100 picoseconds, which is very fast even for 1 gigabit/second signaling and implies a sub-bit common mode tracking response.

While the invention has been described with reference to various embodiments, it will be understood that these embodiments are illustrative and that the scope of the invention is not limited to them. Many variations, modifications, additions, and improvements of the embodiments described are possible. For example, regarding the signals described herein, those skilled in the art will recognize that a signal may be directly transmitted from a first logic block to a second logic block, or a signal may be modified (e.g., amplified, attenuated, delayed, latched, encoded, decoded, inverted, filtered, divided, digitized or otherwise converted, etc.) between the logic blocks. Although the signals of the above described embodiment are characterized as transmitted from one block to the next, other embodiments of the invention include modified signals in place of such directly transmitted signals. To some extent, a second signal input at a second logic block is always a signal derived from a first signal output from a first logic block due to physical limitations of the circuitry involved (e.g., there will always be some attenuation and delay). Therefore, as used herein, a second signal derived from a first signal includes the first signal or any modifications to the first signal, whether due to circuit limitations or due to passage through other circuit elements.

Furthermore, those skilled in the art will recognize that circuit elements in circuit diagrams and boundaries between logic blocks are merely illustrative and that alternative embodiments may merge logic blocks or circuit elements or impose an alternate decomposition of functionality upon various logic blocks or circuit elements. Moreover, alternative embodiments may combine multiple instances of a particular component. Also, although the transistors of the above described embodiment are IGFETs, those skilled in the art will recognize that other types of transistors (e.g., bipolar transistors) and other circuits configured to perform similar functions may be used where appropriate. These and other variations, modifications, additions, and improvements may fall within the scope of the invention as defined in the claims which follow.

What is claimed is:

1. An apparatus comprising:
   a differential input resistance circuit for providing resistance to a differential signal including a first input signal and a second input signal, the differential input resistance circuit including first and second parallel transistor resistors coupled to receive the first and second input signals at first and second inputs respectively, each parallel transistor resistor including
      a first transistor of a first type including a first control terminal and first and second current handling terminals, the first control terminal being coupled to receive a first control signal; and
      a second transistor of a second type including
         a second control terminal coupled to receive a second control signal;
         a first current handling terminal coupled to the first current handling terminal of the first transistor to provide one of the first and second inputs; and
         a second current handling terminal coupled to the second current handling terminal of the first transistor to provide one of first and second outputs of the first and second parallel transistor resistors; and
   a control circuit coupled to provide the first and second control signals for biasing the respective first and second transistors so that a first derivative of a resistance of the parallel transistor resistor in relation to an input-to-output voltage is zero at a selectable operation point; wherein
   the control terminals are coupled to a common mode portion of the differential signal to track common mode bounces on the first and second parallel transistor resistor input nodes.

2. The apparatus of claim 1 wherein the control terminals are capacitively coupled to the common mode portion of the differential signal.

3. An apparatus for providing differential signal equalization, the apparatus comprising:
   a differential input resistance circuit for providing resistance to a differential signal including a first input signal and a second input signal, the differential input resistance circuit including first and second parallel transistor resistors coupled to receive the first and second input signals at first and second inputs respectively, each parallel transistor resistor including
      a first transistor of a first type including a first control terminal and first and second current handling terminals, the first control terminal being coupled to receive a first control signal; and
      a second transistor of a second type including
         a second control terminal coupled to receive a second control signal;
         a first current handling terminal coupled to the first current handling terminal of the first transistor to provide one of the first and second inputs; and
         a second current handling terminal coupled to the second current handling terminal of the first transistor to provide one of first and second outputs of the first and second parallel transistor resistors; and
   a control circuit coupled to provide the first and second control signals, the control circuit including
      first and second resistors, the first resistor having a first terminal coupled to the first input and a second terminal coupled to a common mode voltage node, the second resistor having a first terminal coupled to the second input and a second terminal coupled to the common mode voltage node; and
      first and second capacitors, the first capacitor having a first terminal coupled to the common mode voltage node and a second terminal coupled to a first resistance control node, the second capacitor having a first terminal coupled to the common mode voltage node and a second terminal coupled to a second resistance control node, the first resistance control node coupled to provide the first control signal, the second resistance control node coupled to provide the second control signal.

4. The apparatus of claim 3 wherein the first and second resistors of the control circuit are parallel transistor resistors wherein the control terminals of the transistors of the first type are coupled to a first power rail to bias the transistors of the first type to conduct, and the control terminals of the transistors of the second type are coupled to a second power rail to bias the transistors of the second type to conduct.

5. The apparatus of claim 4 wherein
the first type is n-channel;
the second type is p-channel;
the first power rail is VDD; and
the second power rail is ground.

6. The apparatus of claim 3 wherein the control circuit further comprises:
first and second charge pumps coupled to the respective resistance control nodes for controlling the voltage of the resistance control nodes.

7. The apparatus of claim 3 wherein
the first and second capacitors are capacitor-configured transistors;
the first resistance control node is coupled to first and second current handling terminals of the first capacitor-configured transistor;
the second resistance control node is coupled to a control terminal of the second capacitor-configured transistor;
the common mode voltage node is coupled to a control terminal of the first capacitor-configured transistor and to first and second current-handling terminals of the second capacitor-configured transistor.

8. The apparatus of claim 3 wherein
the first type is n-channel; and
the second type is p-channel.

9. An apparatus for providing a differential line termination circuit, the apparatus comprising:
a differential input resistance circuit for providing resistance to a differential signal including a first input signal and a second input signal, the differential input resistance circuit including first and second parallel transistor resistors coupled to receive the first and second input signals at first and second inputs respectively, each parallel transistor resistor including
a first transistor of a first type including a first control terminal and first and second current handling terminals, the first control terminal being coupled to receive a first control signal; and
a second transistor of a second type including
a second control terminal coupled to receive a second control signal;
a first current handling terminal coupled to the first current handling terminal of the first transistor to provide one of the first and second inputs; and
a second current handling terminal coupled to the second current handling terminal of the first transistor to provide one of first and second output nodes of the first and second parallel transistor resistors, the output nodes of the first and second parallel transistor resistors being coupled together to provide a common mode voltage node; and
a control circuit coupled to provide the first and second control signals for biasing the respective first and second transistors so that a first derivative of a resistance of the parallel transistor resistor in relation to an input-to-output voltage is zero at a selectable operation point.

10. The apparatus of claim 9 wherein the control circuit comprises:
a first amplifier for generating the first control signal, the first amplifier coupled to receive a first reference value and a first comparison value via first and second inputs, the first amplifier driving the first control signal in a first polar direction if the first reference value is greater than the first comparison value, the first amplifier driving the first control signal in a second polar direction if the first reference value is less than the first comparison value, the first amplifier receiving feedback via the second input; and
a second amplifier for generating the second control signal, the second amplifier coupled to receive a second reference value and a second comparison value via first and second inputs, the second amplifier driving the second control signal in a first polar direction if the second reference value is greater than the second comparison value, the second amplifier driving the second control signal in a second polar direction if the second reference value is less than the second comparison value, the second amplifier receiving feedback via the second input.

11. The apparatus of claim 10 wherein the control circuit comprises:
a first bias circuit for generating the first control signal, the first bias circuit including
the first amplifier;
a first reference circuit for generating the first reference signal;
a first comparison control circuit for generating the first comparison signal; and
a second bias circuit for generating the second control signal, the second bias circuit including
the second amplifier;
a second reference circuit for generating the second reference signal;
a second comparison control circuit for generating the comparison signal.

12. The apparatus of claim 11 wherein
the first reference circuit is a first voltage divider coupled between a first power node and the common mode voltage node;
the first comparison control circuit is a second voltage divider coupled between the first power node and the common mode voltage node;
the second reference circuit is a third voltage divider coupled between a second power node and the common mode voltage node;
the second comparison control circuit is a fourth voltage divider coupled between the second power node and the common mode voltage node.

13. The apparatus of claim 12 wherein
the first and second parallel transistor resistors and the first and third voltage dividers are included within an integrated circuit chip;
the second voltage divider includes
a first resistance having a first terminal coupled to the first power node; and
a second resistance on the integrated circuit chip, the second resistance having a first terminal coupled to the common mode voltage node and a second terminal coupled to a second terminal of the first resistance; and
the fourth voltage divider includes
a first resistance having a first terminal coupled to the second power node; and
a second resistance on the integrated circuit chip, the second resistance having a first terminal coupled to the common mode voltage node and a second terminal coupled to the second terminal of the first resistance.

14. The apparatus of claim 13 wherein the second resistance is a first type transistor, the first terminal of the second resistance being a first current handling terminal, the second terminal of the second resistance being a second current handling terminal, the second current handling terminal of the second resistance being coupled to the second input of the first amplifier; and the fourth resistance is a second type transistor, the first terminal of the fourth resistance being a first current handling terminal, the second terminal of the fourth resistance being a second current handling terminal, the second current handling terminal of the fourth resistance being coupled to the second input of the second amplifier.

15. The apparatus of claim 9 wherein the transistors of the first and second parallel transistor resistors are field effect transistors.

* * * * *